(12) United States Patent
Park et al.

(10) Patent No.: US 10,547,003 B2
(45) Date of Patent: Jan. 28, 2020

(54) DEPOSITION APPARATUS

(71) Applicant: SAMSUNG DISPLAY CO., LTD., Yongin-si, Gyeonggi-do (KR)

(72) Inventors: Jae Wan Park, Yongin-si (KR); Ju Eel Mun, Yongin-si (KR); Seung Ki Kang, Yongin-si (KR); In Hyun Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 140 days.

(21) Appl. No.: 15/429,740

(22) Filed: Feb. 10, 2017

(65) Prior Publication Data
US 2018/0019395 A1  Jan. 18, 2018

(30) Foreign Application Priority Data

Jul. 12, 2016 (KR) ........................ 10-2016-0088199

(51) Int. Cl.
| | |
|---|---|
| C23C 16/00 | (2006.01) |
| H01L 51/00 | (2006.01) |
| C23C 14/24 | (2006.01) |
| C23C 14/54 | (2006.01) |
| H01L 21/67 | (2006.01) |
| H01L 21/66 | (2006.01) |
| H01L 51/56 | (2006.01) |

(52) U.S. Cl.
CPC ............ *H01L 51/001* (2013.01); *C23C 14/24* (2013.01); *C23C 14/54* (2013.01); *H01L 21/67109* (2013.01); H01L 21/67248 (2013.01); *H01L 21/67253* (2013.01); *H01L 22/12* (2013.01); *H01L 51/56* (2013.01)

(58) Field of Classification Search
CPC .................................................... C23C 14/24
See application file for complete search history.

(56) References Cited

U.S. PATENT DOCUMENTS

| | | | | |
|---|---|---|---|---|
| 5,622,567 A | * | 4/1997 | Kojima ................. | C23C 14/022 118/726 |
| 5,937,272 A | | 8/1999 | Tang | |
| 8,184,302 B2 | * | 5/2012 | Zoller ................ | G01B 11/0683 118/726 |
| 2007/0178225 A1 | * | 8/2007 | Takanosu .............. | C23C 14/243 427/69 |
| 2010/0279021 A1 | * | 11/2010 | Park ........................ | B05D 1/02 427/427.3 |
| 2012/0295014 A1 | * | 11/2012 | Guyaux .................. | C23C 14/24 427/9 |
| 2014/0010957 A1 | * | 1/2014 | Inoue ..................... | C23C 14/042 427/248.1 |

(Continued)

FOREIGN PATENT DOCUMENTS

CN   201510217702.X   *  5/2015   ............. C23C 14/54

*Primary Examiner* — Keath T Chen
(74) *Attorney, Agent, or Firm* — Cantor Colburn LLP

(57) ABSTRACT

A deposition apparatus includes a chamber, a first stage and a second stage for supporting substrates within the chamber, an evaporating source assembly moving a first stage area corresponding to the first stage and a second stage area corresponding to the second stage, and including a plurality of nozzles through which a source material is spurted, and a photographing assembly which is disposed between the first stage and the second stage and photographs the plurality of nozzles.

15 Claims, 4 Drawing Sheets

(56) References Cited

U.S. PATENT DOCUMENTS

| | | |
|---|---|---|
| 2016/0083172 A1 | 3/2016 | Ogata et al. |
| 2016/0084503 A1 | 3/2016 | Hawie et al. |
| 2016/0215384 A1* | 7/2016 | Jeong .................... C23C 14/243 |
| 2016/0230265 A1* | 8/2016 | Darwish ................. C23C 14/06 |
| 2016/0340770 A1* | 11/2016 | Dai ..................... C23C 14/5806 |
| 2017/0029938 A1* | 2/2017 | Hu ......................... C23C 14/54 |

* cited by examiner

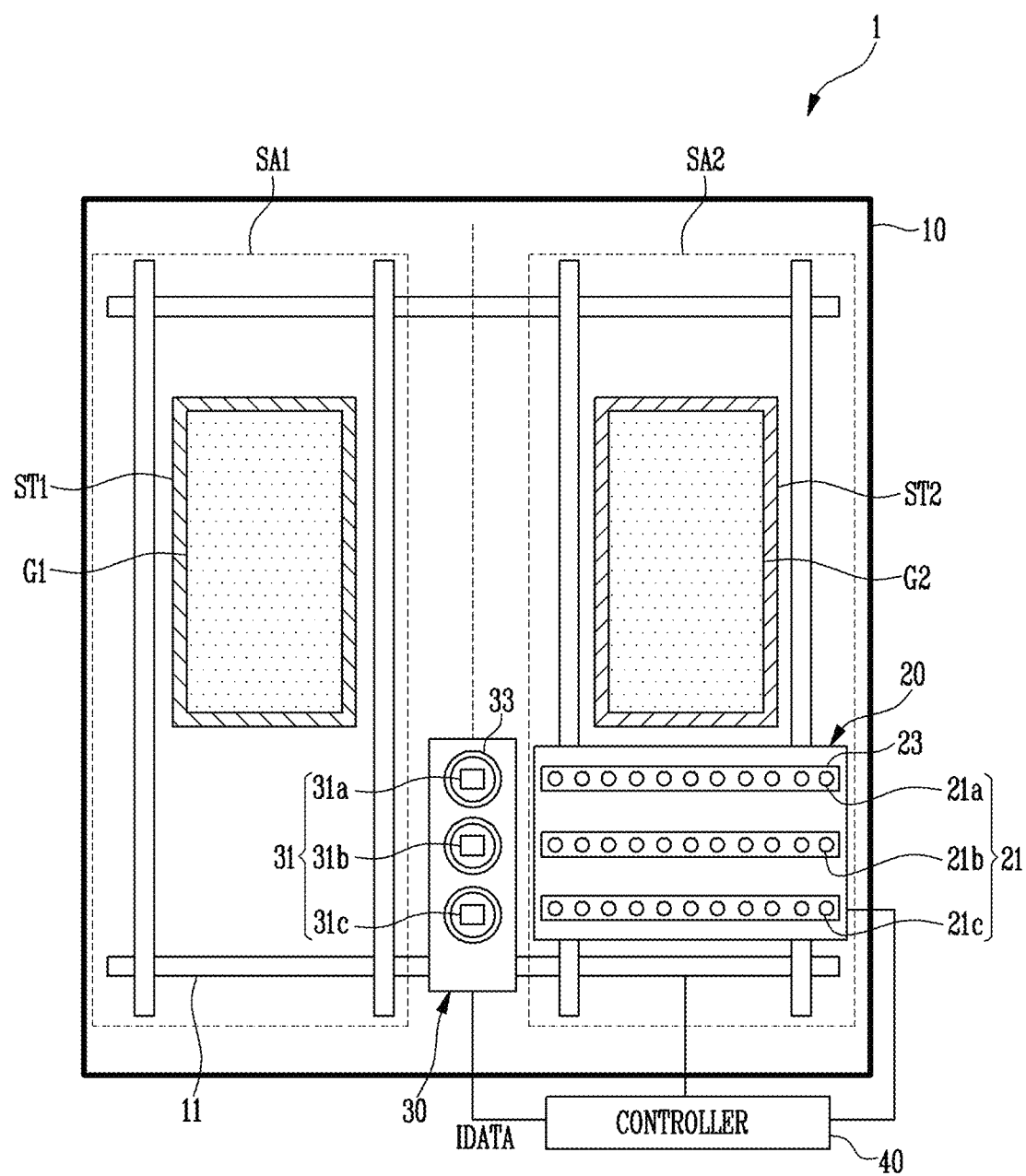

DEPOSITION APPARATUS

This application claims priority to Korean Patent Application No. 10-2016-0088199, filed on Jul. 12, 2016, and all the benefits accruing therefrom under 35 U.S.C. § 119, the content of which in its entirety is herein incorporated by reference.

BACKGROUND

1. Field

Exemplary embodiments of the invention relate to a deposition apparatus.

2. Description of the Related Art

In general, in order to manufacture an organic light emitting display panel, a depositing process for forming an organic thin film on a substrate is performed. When a source material is inserted into an evaporating source within a chamber and is heated, a vapor of the evaporated source material passes through a predetermined mask pattern and is seated on the substrate. In an organic thin film depositing process, it is desired to induce uniform growth of an organic thin film.

SUMMARY

In an organic thin film depositing process, a phenomenon, in which a source material is attached to nozzles, through which the source material is discharged, and holes of nozzles are blocked, may be generated. When the nozzles are blocked, a material may be non-uniformly applied during the depositing process. Accordingly, a thickness of the organic thin film deposited on the substrate is non-uniform, and the manufactured substrate may have a defect.

An exemplary embodiment of the invention provides a deposition apparatus, including a chamber, a first stage and a second stage for supporting substrates within the chamber, an evaporating source assembly which moves between a first stage area corresponding to the first stage and a second stage area corresponding to the second stage, and includes a plurality of nozzles through which a source material is spurted, and a photographing assembly which is disposed between the first stage and the second stage and photographs the plurality of nozzles.

In an exemplary embodiment, the apparatus may further include a controller which determines blocking states of the plurality of nozzles based on image data provided from the photographing assembly. In an exemplary embodiment, the apparatus may further include a driving assembly which moves the evaporating source assembly. In an exemplary embodiment, the evaporating source assembly may further include an evaporating container which accommodates the source material, a heat reflecting plate, on which the plurality of nozzles are arranged, and which covers the evaporating container, and a heating unit which heats the source material.

In an exemplary embodiment, the controller may include an image analyzing unit which analyzes the image data, a driving controller which controls the driving assembly so that the evaporating source assembly moves between the first stage area and the second stage area, and a heating controller which controls a degree of heating of the heating unit. In an exemplary embodiment, when it is determined that a predetermined number or more of nozzles among the plurality of nozzles are blocked, the controller may control the heating unit to radiate heat.

In an exemplary embodiment, the apparatus may further include a display unit which displays the blocking states of the plurality of nozzles. In an exemplary embodiment, when a degree of blocking of a nozzle opening area of any one nozzle among the plurality of nozzles is equal to or larger than a reference value, the controller may make a warning through the display unit.

In an exemplary embodiment, the photographing assembly may be provided on a movement path of the evaporating source assembly and may photograph the plurality of nozzles of the moving evaporating source assembly. In an exemplary embodiment, a number of times of photographing of the photographing assembly may correspond to a number of nozzles included in one nozzle row. In an exemplary embodiment, the controller may control the photographing assembly so as to photograph at a predetermined timing whenever the evaporating source assembly moves between the first stage area and the second stage area.

In an exemplary embodiment, the photographing assembly may further include a housing in which an internal space is defined, a plurality of cameras disposed within the housing, lighting units corresponding to the plurality of camera units, and an observation window disposed on a front surface of the housing facing the evaporating source assembly.

In an exemplary embodiment, an internal side of the housing may be maintained in an atmospheric pressure state. In an exemplary embodiment, a number of camera units may be the same as a number of nozzle rows arranged in the evaporating source assembly.

In an exemplary embodiment, the apparatus may further include a shutter unit which is provided between the evaporating source assembly and the photographing assembly and which opens and closes an area corresponding to the observation window. In an exemplary embodiment, the apparatus may further include a cover glass unit detachable between the photographing assembly and the shutter unit. In an exemplary embodiment, the apparatus may further include an adhesion preventing plate which prevents the source material from contacting an area other than an area corresponding to the observation window.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

FIG. 1 a top plan view illustrating a deposition apparatus according to an exemplary embodiment of the invention.

DETAILED DESCRIPTION

Figure 2A:
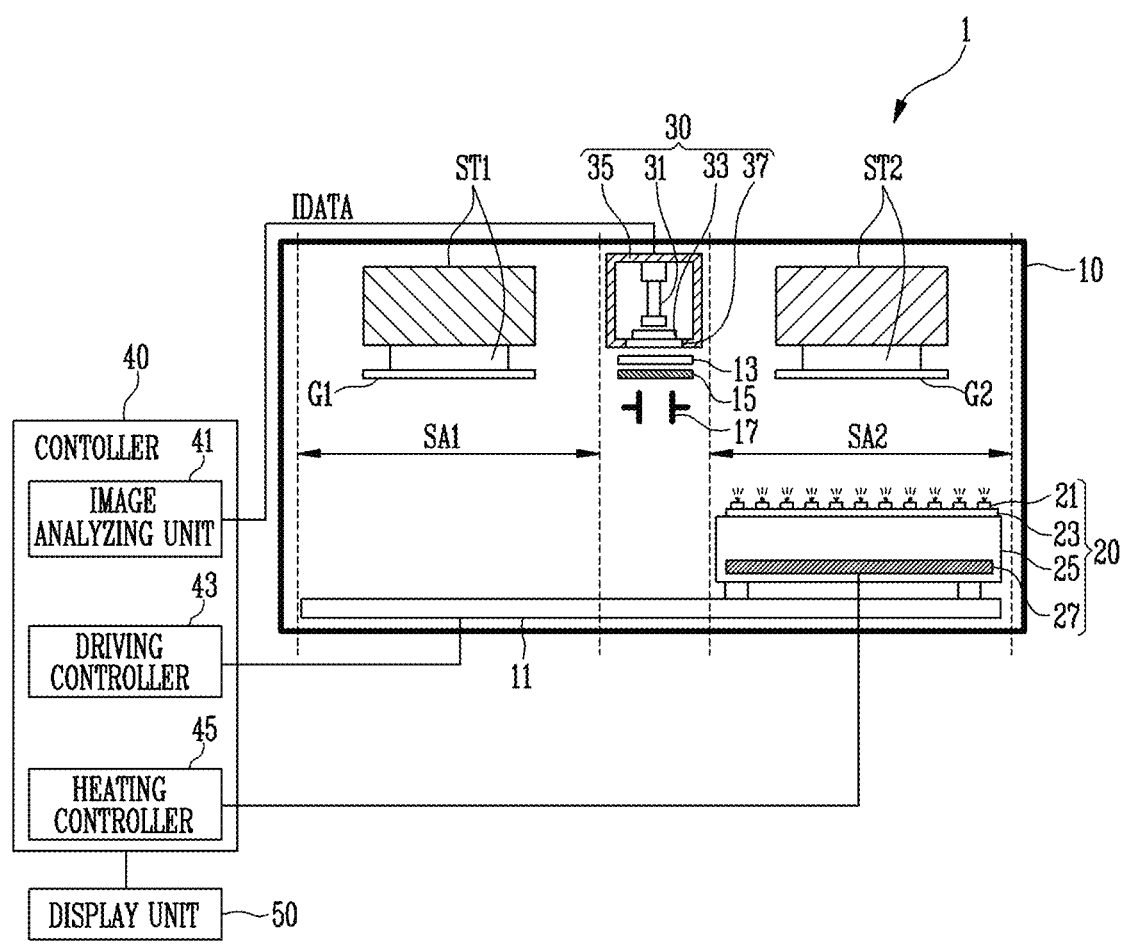
FIG. 2A is a cross-sectional view illustrating the deposition apparatus of FIG. 1.

Hereinafter, an exemplary embodiment of the invention will be described in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present. It will be understood that when an element is referred to as being "between" two elements, it can be the only element between the two elements, or one or more intervening elements may also be present. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The terms "controller" and "analyzing unit" in the specification may refer to a special purpose processor of which a structure is well know to one having ordinary skill in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 a top plan view illustrating a deposition apparatus according to an exemplary embodiment of the invention.

Referring to FIG. 1, the deposition apparatus 1 according to the exemplary embodiment of the invention may include a chamber 10, a first stage ST1, a second stage ST2, an evaporating source assembly 20, a photographing assembly 30, and a controller 40.

A space, in which a depositing process is performed, is defined in the chamber 10. Spaces for processing a plurality of substrates G1 and G2 are defined in the chamber 10. To this end, the chamber 10 may include a plurality of stages ST1 and ST2 for performing the depositing process for the substrates G1 and G2, respectively. The stages ST1 and ST2 will be described below.

An internal side of the chamber 10 may be maintained with a predetermined level of vacuum state so that the depositing process is more smoothly performed, and a vacuum pump (not illustrated) for creating the vacuum state may be connected to the chamber 10. Further, the chamber 10 may be provided with an inlet/outlet (not illustrated) for carrying in and carrying out the substrates G1 and G2.

In an exemplary embodiment, the chamber 10 may be manufactured of a metal material, such as aluminum, stainless, and copper. In another exemplary embodiment, the chamber 10 may be manufactured of coated metal, for example, anodized aluminum or nickel plated aluminum. In another exemplary embodiment, the chamber 10 may also be manufactured of refractory metal. In an exemplary embodiment, an entirety or a part of the chamber 10 may be manufactured of an electric insulating material, such as quartz and ceramic. In exemplary embodiments, the chamber 10 may have a structure, for example, a circular structure, a quadrangular structure. However, the invention is not limited thereto, and chamber 10 may include any type of structure, appropriate for performing a depositing process on the substrates G1 and G2.

The substrates G1 and G2 may be substrates for manufacturing an organic light emitting display panel. However, the substrates G1 and G2 are not limited to the display panel, and may be semiconductor substrates, such as wafers, for manufacturing a semiconductor device.

The first and second stages ST1 and ST2 have configurations for supporting the substrates G1 and G2 within the chamber 10. In the illustrated exemplary embodiment, the first and second stages ST1 and ST2 are disposed (e.g., positioned) on the chamber 10, and have an upper chucking structure, in which the depositing process is performed in a state where the first and second stages ST1 and ST2 respectively support the substrates G1 and G2 such that surfaces of the substrates G1 and G2 which are to be processed face a lower side.

The first stage ST1 is disposed (e.g., positioned) on one side (e.g., left side in FIGS. 1 and 2) of the chamber 10, and the second stage ST2 is disposed (e.g., positioned) on the other side (e.g., right side in FIGS. 1 and 2) of the chamber 10. The first stage ST1 and the second stage ST2 have substantially the same structure with each other, so that hereinafter, only the first stage ST1 will be described.

The first stage ST1 supports the processed surface of the first substrate G1 to be exposed in the down direction. In an exemplary embodiment, the first stage ST1 may mechanically fix the first substrate G1 by a substrate support unit (not illustrated) for supporting the first substrate G1, for example. In another exemplary embodiment, the first stage ST1 may adsorb and fix the first substrate G1 by hydraulic pressure, for example. The first stage ST1 may have various forms and structures according to a size and a process of the first substrate G1.

In the illustrated exemplary embodiment, the deposition apparatus 1 includes the two stages ST1 and ST2, but the invention is not limited thereto. In another exemplary embodiment, the deposition apparatus 1 may include three or more stages.

The evaporating source assembly 20 accommodates a source material therein and provides the source material evaporated by heating. In the illustrated exemplary embodiment, the evaporating source assembly 20 has a structure, which is disposed (e.g., positioned) under the chamber 10 and provides the source material in an up direction in a cross sectional view. The evaporating source assembly 20 includes a plurality of nozzles 21 through which the source material is spurted.

The nozzles 21 may be disposed in a unit of a line, and the nozzles 21 may be disposed in two or more rows. In the illustrated exemplary embodiment, the nozzles 21 may be disposed on an upper surface of the evaporating source assembly 20 in three rows, and the three rows of the nozzles 21 are sequentially referred to as a first nozzle row, a second nozzle row, and a third nozzle row from one side (e.g., from an upper side to a lower side in FIG. 1).

Sizes and intervals of the nozzles 21 may be uniform or may be changed depending on positions thereof. The nozzles 21 may be used in consideration of the kind of process and a characteristic of a source material.

The evaporating source assembly 20 may perform a depositing process while moving within the chamber 10. Particularly, the evaporating source assembly 20 may move between a first stage area SA1 corresponding to the first stage ST1 and a second stage area SA2 corresponding to the second stage ST2. To this end, the chamber 10 may further include a driving assembly 11 for moving the evaporating source assembly 20.

In the illustrated exemplary embodiment, the evaporating source assembly 20 may perform a continuous depositing process while repeatedly moving between the first stage area SA1 and the second stage area SA2 by the driving assembly 11. Further, the evaporating source assembly 20 may perform reciprocating scan motion so that the source material is uniformly spurted by the driving assembly 11 during the depositing process for the first substrate G1 or the second substrate G2.

In an exemplary embodiment, the evaporating source assembly 20 may perform the depositing process on the first substrate G1 in a state of being disposed (e.g., positioned) in the first stage area SA1, for example. Further, when the depositing process for the first substrate G1 is completed, the evaporating source assembly 20 moves to the second stage area SA2 by the driving assembly 11. Further, the evaporating source assembly 20 may perform the depositing process on the second substrate G2 in a state of being disposed (e.g., positioned) in the second stage area SA2. Further, when the depositing process for the second substrate G2 is completed, the evaporating source assembly 20 moves to the first stage area SA1 by the driving assembly 11.

The driving assembly 11 may include a driving motor (not illustrated) providing power for a movement between the stage areas (e.g., the first stage area SA1 and the second stage area SA2) of the evaporating source assembly 20 and the scan motion within one stage area of the evaporating source assembly 20, and a rail member guiding a movement path of the evaporating source assembly 20. However, the driving assembly 11 is not limited to the illustrated exemplary embodiment, and may have various modified examples for up-down, front-back, and left-right driving the evaporating source assembly 20.

The photographing assembly 30 is disposed between the first stage ST1 and the second stage ST2 and photographs the nozzles 21. The photographing assembly 30 is disposed (e.g., positioned) on the chamber 10, and photographs toward a lower side, at which the evaporating source assembly 20 is disposed (e.g., positioned). A photographed area of the photographing assembly 30 may be located between the first stage area SA1 and the second stage area SA2.

In the illustrated exemplary embodiment, the photographing assembly 30 may include a plurality of camera units 31, and lighting units 33 corresponding to the camera units 31. The camera units 31 may include charge-coupled devices ("CCDs"), and may photograph parts of the nozzles 21 passing through the photographed area in the unit of the line and generate optical image data IDATA. The lighting units 33 may be prepared so as to emit light toward the nozzles 21, and may be controlled to emit light only when photographing.

The photographing assembly 30 is provided on the movement path of the evaporating source assembly 20, and photographs the nozzles 21 of the moving evaporating source assembly 20. In the exemplary embodiment, the number of camera units 31 may be the same as the row of nozzles arranged in the evaporating source assembly 20. When the number of rows of the nozzles 21 disposed in the evaporating source assembly 20 is three, three cameras 31 may be provided, for example.

In an exemplary embodiment, the camera units 31 may include a first camera unit 31a, a second camera unit 31b, and a third camera unit 31c, for example. The first camera unit 31a photographs the nozzles 21a of the first nozzle row, the second camera unit 31b photographs the nozzles 21b of the second nozzle row, and the third camera unit 31c photographs the nozzles 21c of the third nozzle row.

In the exemplary embodiment, the number of times of photographing of the photographing assembly 30 may corresponding to the number of nozzles included in one nozzle row. In an exemplary embodiment, when each nozzle row includes 11 nozzles, the camera units 31 sequentially photograph 11 times when the evaporating source assembly 20 passes through the photographed area and obtain image data IDATA for each nozzle, for example.

In the meantime, in order to prevent a process time loss (e.g., tact time loss), the evaporating source assembly 20 moves without stop during the movement between the stages (e.g., the first and second stages ST1 and ST2), so that the photographing assembly 30 may have performance of photographing the nozzles several times within a short time.

The controller 40 may perform a general control on the chamber 10 and the deposition apparatus 1 including the chamber 10. The controller 40 is electrically connected with the driving assembly 110, the evaporating source assembly 20, and the photographing assembly 30, and may be combined to a part of the chamber 10, or may be configured as a separate configuration, for example, a computer system, separated from the chamber 10.

The controller 40 may control or detect the carry-in of the substrates G1 and G2 into the chamber 10 and the carry-out of the substrates G1 and G2 from the chamber 10. Further, the controller 40 may control the evaporating source assembly 20 so as to perform the depositing process on the substrates G1 and G2 which are carried into the chamber 10. Further, the controller 40 may control the driving assembly 11 so that the evaporating source assembly 20 moves between the first stage area SA1 and the second stage area SA2.

In the exemplary embodiment, the controller 40 may control the photographing assembly 30 so as to photograph the nozzles at a predetermined timing whenever the evaporating source assembly 20 moves between the first stage area SA1 and the second stage area SA2. In an exemplary embodiment, the controller 40 may synchronize a driving control signal commanding the driving assembly 11 to move between the stages (e.g., the first and second stages ST1 and ST2), and a photographing control signal commanding the photographing assembly 30 to photograph, for example.

The controller 40 determines block states of the nozzles 21 based on the image data IDATA provided from the photographing assembly 30. In the exemplary embodiment, the controller 40 may process and analyze the image data IDATA and discriminate a nozzle opening area NOA (refer to FIG. 2C) and a foreign material area MA (refer to FIG. 2C) through a difference in brightness or color between unit pixels. In this case, the controller 40 may compare the image data with pre-stored reference data in order to accurately determine a nozzle image.

Figure 2B:
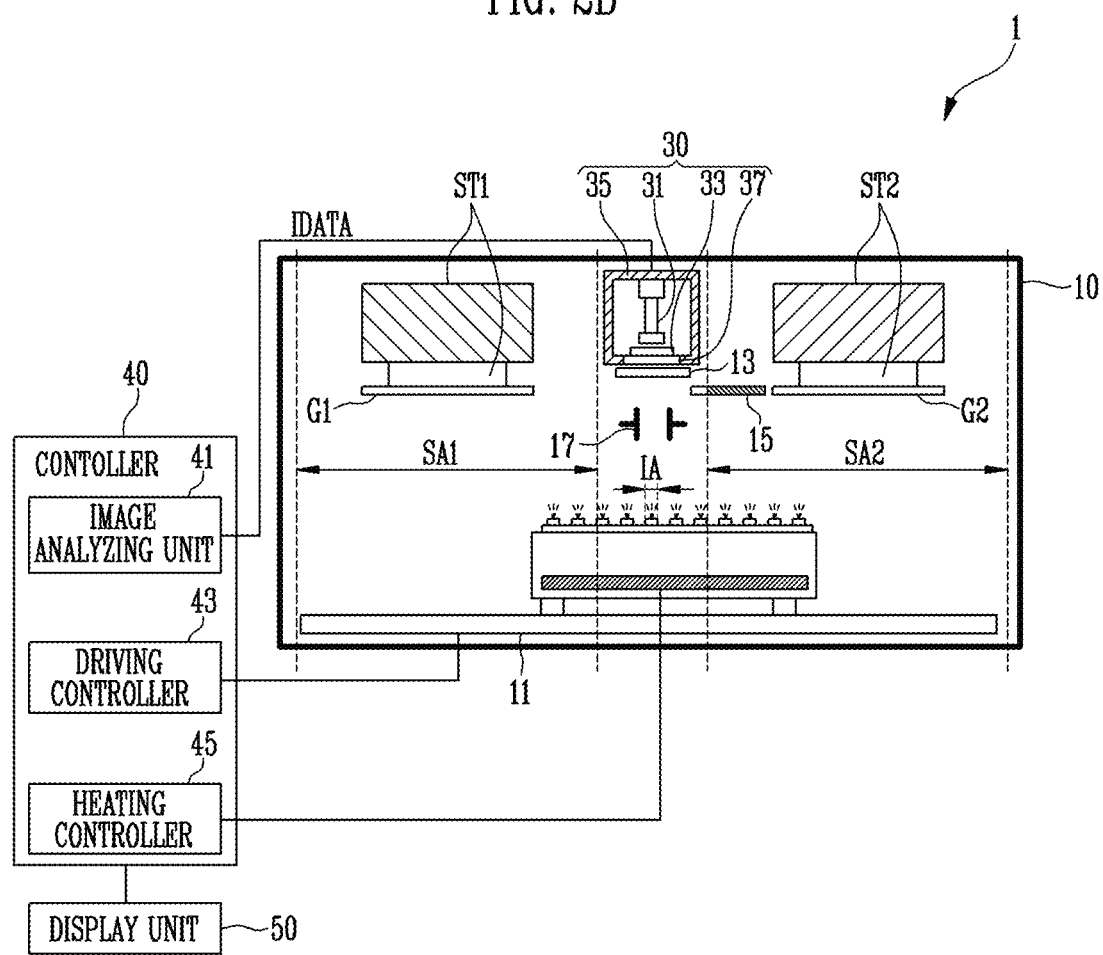
FIG. 2B is a diagram for describing an example, in which a photographing assembly photographs nozzles.
Figure 2C:
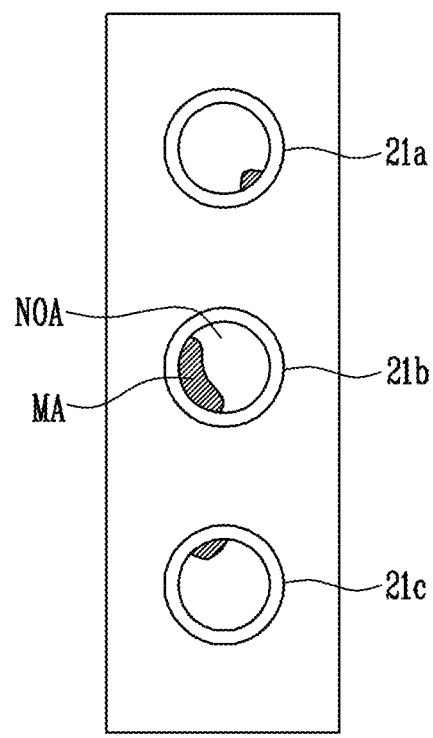
FIG. 2C is a diagram illustrating an example of an image of a nozzle provided based on image data.

Further, the controller 40 may determine the degree of blocking corresponding to a size ratio of the foreign material area MA (refer to FIG. 2C) to the nozzle opening area NOA (refer to FIG. 2C). When the degree of blocking of a nozzle is equal to or larger than a reference value, the controller 40 may determine that the corresponding nozzle is blocked.

The deposition apparatus 1 according to the illustrated exemplary embodiment may be applied to a deposition apparatus 1 for manufacturing a semiconductor device, such as a memory or a logic circuit, in which an element layer is provided by vapor generated from a source material or deposition of a reaction product of the source material, or a deposition apparatus 1 for manufacturing a display device, such as an organic light emitting diode. However, this is illustrative, and the deposition apparatus 1 according to the illustrated exemplary embodiment may be applied to all of the deposition apparatuses including a structure, in which a source material is spurted through a nozzle.

FIG. 2A is a cross-sectional view illustrating the deposition apparatus 1 of FIG. 1, FIG. 2B is a diagram for describing an example, in which the photographing assembly photographs the nozzles, and FIG. 2C is a diagram illustrating an example of an image of the nozzle provided based on image data.

Referring to FIG. 2A, the evaporating source assembly 20 may further include a heat reflecting plate 23, an evaporating container 25, and a heating unit 27.

The heat reflecting plate 23 covers the evaporating container 25, and the nozzles 21 are arranged on the heat reflecting plate 23. The heat reflecting plate 23 reduces heat loss of the evaporating source assembly 20. The number of heat reflecting plates 23 may be the same as the row of nozzles arranged in the evaporating source assembly 20.

A space for accommodating the source material is defined in the evaporating container 25. In the illustrated exemplary embodiment, the evaporating container 25 has a shape of a rectangular container in a cross-sectional view. In an exemplary embodiment, the source material may include a polymer organic material, a low molecular organic material, a polymer, an inorganic material, and the like, and may be solid or liquid, for example.

In an exemplary embodiment, any one or a combination of a metal material, such as stainless steel, aluminum, titanium, and copper, a material, such as quarts and glass, by which an inside may be observed, and a material, such as ceramic, having an insulation effect may be selected as a material of a part or an entirety of the evaporating container 25, but the invention is not limited thereto.

The heating unit 27 evaporates the source material accommodated in the evaporating container 25. The heating unit 27 may be disposed in (e.g., buried in) the evaporating container 25, or may be attached to an external surface of the evaporating container 25. The kind of heating unit 27 is not particularly limited. In an exemplary embodiment, the heating unit 27 may be a heating coil or a heating sheet, for example. In another exemplary embodiment, the heating unit 27 may also be a radiation heater, a fluid circulation heater, and an induction heater, for example.

In the exemplary embodiment, the photographing assembly 30 may further include a housing 35 in which an internal space for accommodating the plurality of cameras 31 is defined, and an observation window 37 disposed on a front surface of the housing 35 which faces the evaporating source assembly 20.

The housing 35 may be disposed (e.g., positioned) on the chamber 10, and may be provided with the observation window 37 facing the lower side. The cameras 31 and the lighting units 33 are disposed (e.g., installed) within the housing 35, and the internal side of the housing 35 may be maintained in an atmospheric pressure state. Since the chamber 10 is in a vacuum state, the housing 35 has a structure sealed from the outside.

In the exemplary embodiment, the deposition apparatus 1 may further include a cover glass unit 13, a shutter unit 15, and an adhesion preventing plate 17.

The cover glass unit 13 is detachable between the photographing assembly 30 and the shutter unit 15. The cover glass unit 13 prevents the observation window 37 from being contained by the evaporated source material. In order to easily replace the contaminated cover glass unit 13, the cover glass unit 13 may be detachably provided.

The shutter unit 15 is provided between the evaporating source assembly 20 and the photographing assembly 30 and opens and closes an area corresponding to the observation window 37. The shutter unit 15 is opened during the photographing of the photographing assembly 30, and is maintained in a close state in a time other than the photographing time of the photographing assembly 30 to prevent the photographing assembly 30 from being contaminated. In the illustrated exemplary embodiment, the shutter unit 15 is applied to a sliding type, for example.

The adhesion preventing plate 17 has a configuration for preventing the source material from contacting an area, other than the area corresponding to the observation window 37. The adhesion preventing plate 17 is provided between the shutter unit 15 and the evaporating source assembly 20 to prevent a surrounding area of the photographing assembly 30 from being contaminated.

In the exemplary embodiment, the controller 40 may include an image analyzing unit 41 analyzing the image data IDATA, a driving controller 43 controlling the driving assembly 11 so that the evaporating source assembly 20 moves between the first stage area SA1 and the second stage area SA2, and a heating controller 45 controlling the degree of heating of the heating unit 27.

In the exemplary embodiment, the controller 40 may determine the block states of the nozzles 21 by the image analyzing unit 41, and control the heating unit 27 to radiate heat according to the determination result. In this case, the controller 40 may control only a part of the hating unit 27 adjacent to the nozzles 21 to radiate heat. When the heating unit 27 radiates heat and a temperature of the nozzles 21 is increased by a predetermined level, the source material stuck to the contaminated nozzles is evaporated and cleaned.

Particularly, when it is determined that the predetermined number or more of nozzles among the nozzles 21 are blocked, the controller 40 may control the heating unit 27 to radiate heat. In an exemplary embodiment, when it is determined that two or more nozzles are blocked, the controller 40 may control the heating unit 27 to radiate heat, for example.

Further, when the degree of blocking of a nozzle opening area of any one nozzle among the nozzles is equal to or larger than a reference value, the controller 40 may control the heating unit 27 to radiate heat. In an exemplary embodiment, when it is determined that a foreign material area MA (refer to FIG. 2C) intrudes into a substantially large area of the nozzle opening area NOA (refer to FIG. 2C), the controller 40 may control the heating unit 27 to radiate heat, for example.

Accordingly, the deposition apparatus 1 may monitor the blocking states of the nozzles 21 and perform a cleaning operation on the contaminated nozzles.

In the exemplary embodiment, the deposition apparatus 1 may further include a display unit 50 for displaying the blocking states of the nozzles 21. The display unit 50 displays information about the blocking states of the nozzles 21 drawn by the controller 40. Further, the display unit 50 may display various messages transmitted from the controller 40. In an exemplary embodiment, the display unit 50 may notify a user of a nozzle image, the degree of blocking of the nozzle, a temperature of the nozzle, a residual amount of the source material, and the like with a text, a sound, alarm light, and the like, for example.

The display unit 50 may be disposed (e.g., mounted) on a side surface of the chamber 10 or may be implemented through a separate monitoring device electrically connected with the chamber 10, and may also be provided together with the controller 40. However, the invention is not limited thereto, and the kind, a position, a form, and a size of the display unit 50 may be variously modified according to a necessity.

Referring to FIGS. 2B and 2C, the evaporating source assembly 20 continuously performs the depositing process while repeatedly moving between the first stage area SA1 and the second stage area SA2 by the driving assembly 11. The photographing assembly 30 photographs the nozzles 21 of the evaporating source assembly 20 which are moving between the first stage area SA1 and the second stage area SA2.

The photographing assembly 30 may photograph a part of the nozzles 21 passing through the photographing area IA in the unit of the line, and generate optical image data IDATA. In this case, the number of times of photographing of the photographing assembly 30 may correspond to the number of nozzles included in one nozzle row. In an exemplary embodiment, when each nozzle row includes 11 nozzles, the camera units 31 sequentially photograph 11 times when the evaporating source assembly 20 passes through the photographed area IA and obtain image data IDATA for each nozzle, for example.

In this case, the shutter unit 15 is opened during the photographing of the photographing assembly 30, and is maintained in a close state in a time other than the photographing time of the photographing assembly 30 to prevent the photographing assembly 30 from being contaminated. That is, the shutter unit 15 is opened while the evaporating source assembly 20 moves between the first stage area SA1 and the second stage area SA2, and is closed in other states.

The controller 40 may provide an entire nozzle image or a part of a nozzle image based on the image data IDATA provided from the photographing assembly 30. The controller 40 determines the blocking states of the nozzles 21 by analyzing the nozzle image. In the exemplary embodiment, the controller 40 may discriminate a nozzle opening area NOA and a foreign material area MA through a difference in brightness or color between unit pixels of the nozzle image. In this case, the controller 40 may compare the image data with pre-stored reference data in order to accurately determine a nozzle image.

Further, the controller 40 may determine the degree of blocking corresponding to a size ratio of the foreign material area MA to the nozzle opening area NOA. When the degree of blocking of a nozzle is equal to or larger than a reference value, the controller 40 may determine that the corresponding nozzle is blocked.

In the exemplary embodiment, the controller 40 may determine the blocking states of the nozzles 21, and warn about the determination result through the display unit 50. In an exemplary embodiment, the display unit 50 may notify a user of a nozzle image, the degree of blocking of the nozzle, a temperature of the nozzle, a residual amount of the source material, and the like with a text, a sound, alarm light, and the like, for example.

In an exemplary embodiment, when the nozzles 21 are arranged in three rows, the nozzle image by once photographing includes the nozzle 21a in the first nozzle row, the nozzle 21b in the second nozzle row, and the nozzle 21c of the third nozzle row, for example. When a size of the foreign material area MA of the nozzle 21b in the second nozzle row among the nozzles 21 is equal to or larger than a reference value, the controller 40 may determine that the nozzle 12b in the second nozzle row is blocked, for example. The controller 40 warns about the blocking state of the nozzle 21*b* in the second nozzle row through the display unit 50.

According to the invention, it is possible to conveniently operate, and maintain and repair the deposition apparatus 1, and secure uniformity of the thin film depositing process by monitoring the blocking states of the nozzles 21 by the photographing assembly 30 disposed between the first stage ST1 and the second stage ST2.

The technical spirit of the invention have been described according to the exemplary embodiment in detail, but the exemplary embodiment has described herein for purposes of illustration and does not limit the invention. Further, those skilled in the art will appreciate that various modifications may be made without departing from the scope and spirit of the invention.

The detailed description of the invention includes the description of the particular exemplary embodiments, but various modification is available within the scope without departing from the scope and the technical spirit of the invention. Therefore, the scope of the invention is not limited to the exemplary embodiments described, but shall be defined by the claims to be described below and the equivalents to the claims.

What is claimed is:

1. A deposition apparatus, comprising:
   a chamber;
   a first stage and a second stage which respectively support substrates within the chamber;
   an evaporating source assembly which moves between a first stage area corresponding to the first stage and a second stage area corresponding to the second stage, and includes a plurality of nozzles through which a source material is spurted; and
   one or more cameras are fixedly disposed between the first stage and the second stage, photographs the plurality of nozzles which are moving between the first stage area and the second stage area such that the one or more cameras do not overlap the substrates in a plan view, and photographs the plurality of nozzles plural times within a predetermined time such that the evaporating source assembly moves without stop during the movement between the first and second stages; and
   a controller configured to control the one or more cameras to photograph one nozzle of the plurality of nozzles at a time.

2. The apparatus of claim 1, wherein
   the controller determines blocking states of the plurality of nozzles based on image data provided from the one or more cameras.

3. The apparatus of claim 2, further comprising:
   a driving motor which moves the evaporating source assembly.

4. The apparatus of claim 3, wherein the evaporating source assembly further includes:
   an evaporating container which accommodates the source material;
   a heat reflecting plate, on which the plurality of nozzles is arranged, and which covers the evaporating container; and
   a heater which heats the source material.

5. The apparatus of claim 4, wherein the controller includes:
   an image analyzer which analyzes the image data;
   a driving controller which controls the driving motor so that the evaporating source assembly moves between the first stage area and the second stage area; and
   a heating controller which controls a degree of heating of the heater.

6. The apparatus of claim 5, wherein when it is determined that a predetermined number or more of nozzles among the plurality of nozzles are blocked, the controller controls the heater to radiate heat.

7. The apparatus of claim 5, further comprising:
   a display which displays the blocking states of the plurality of nozzles.

8. The apparatus of claim 7, wherein when a degree of blocking of a nozzle opening area of any one nozzle among the plurality of nozzles is equal to or larger than a reference value, the controller makes a warning through the display.

9. The apparatus of claim 1, wherein the one or more cameras are provided on a movement path of the evaporating source assembly and photographs the plurality of nozzles of the moving evaporating source assembly.

10. The apparatus of claim 1, wherein the one or more cameras further includes:
    a housing the accommodated the one or more cameras;
    lighting corresponding to the one or more cameras; and
    an observation window disposed on a front surface of the housing facing the evaporating source assembly.

11. The apparatus of claim 10, wherein an internal side of the housing is maintained in an atmospheric pressure state.

12. The apparatus of claim 10, wherein the evaporating source assembly includes one or more nozzle rows, and the number of the cameras is the same as the number of nozzle rows.

13. The apparatus of claim 10, further comprising:
    a shutter which is provided between the evaporating source assembly and the one or more cameras and which opens and closes an area corresponding to the observation window.

14. The apparatus of claim 13, further comprising:
    a cover glass detachable between the one or more cameras and the shutter.

15. The apparatus of claim 10, further comprising:
    an adhesion preventing plate which prevents the source material from contacting an area other than an area corresponding to the observation window.

* * * * *